(12) United States Patent
Bessemoulin (10) Patent No.: US 8,674,356 B2
(45) Date of Patent: Mar. 18, 2014

(54) ELECTRICALLY MEASURABLE ON-CHIP IC SERIAL IDENTIFIER AND METHODS FOR PRODUCING THE SAME

(75) Inventor: Alexandre Jean-Marie Bessemoulin, Chatillon (FR)

(73) Assignee: M/A-COM Technology Solutions Holdings, Inc., Lowell, MA (US)

( * ) Notice: Subject to any disclaimer, the term of this patent is extended or adjusted under 35 U.S.C. 154(b) by 106 days.

(21) Appl. No.: 13/222,138

(22) Filed: Aug. 31, 2011

(65) Prior Publication Data

US 2013/0048981 A1 Feb. 28, 2013

(51) Int. Cl.
*H01L 25/03* (2006.01)

(52) U.S. Cl.
USPC ............. 257/48; 257/209; 257/211; 257/529; 438/128; 438/257; 438/264; 438/267

(58) Field of Classification Search
USPC ............. 257/209, 211, 529, E27.103, E21.68
See application file for complete search history.

(56) References Cited

U.S. PATENT DOCUMENTS

| | | | | |
|---|---|---|---|---|
| 7,015,795 B2* | 3/2006 | Doudoumopolous | ..... | 340/10.42 |
| 7,538,369 B2* | 5/2009 | Kushiyama | ..... | 257/209 |
| 7,616,777 B2* | 11/2009 | Rodriguez et al. | ..... | 382/100 |
| 7,638,369 B2* | 12/2009 | Sakoh et al. | ..... | 438/132 |
| 7,679,150 B2* | 3/2010 | Kasa | ..... | 257/414 |
| 8,003,474 B2* | 8/2011 | Chanda et al. | ..... | 438/333 |
| 8,015,514 B2* | 9/2011 | Jaffe et al. | ..... | 716/54 |
| 8,089,105 B2* | 1/2012 | Barth et al. | ..... | 257/209 |
| 8,154,053 B2* | 4/2012 | Lopes et al. | ..... | 257/203 |
| 8,291,357 B2* | 10/2012 | Bueti et al. | ..... | 716/103 |
| 2002/0173101 A1* | 11/2002 | Shau | ..... | 438/264 |
| 2004/0062084 A1* | 4/2004 | Layman et al. | ..... | 365/189.01 |
| 2005/0138499 A1* | 6/2005 | Pileggi et al. | ..... | 714/724 |
| 2005/0151205 A1* | 7/2005 | Taniguchi et al. | ..... | 257/390 |
| 2006/0138245 A1* | 6/2006 | Lee | ..... | 235/492 |
| 2007/0278615 A1* | 12/2007 | Kushiyama | ..... | 257/529 |
| 2008/0119956 A1* | 5/2008 | Mangell | ..... | 700/121 |
| 2009/0090993 A1* | 4/2009 | Henson et al. | ..... | 257/529 |
| 2009/0091351 A1* | 4/2009 | Bueti et al. | ..... | 326/101 |
| 2009/0094566 A1* | 4/2009 | Bueti et al. | ..... | 716/3 |
| 2010/0213515 A1* | 8/2010 | Lopes et al. | ..... | 257/209 |
| 2010/0284539 A1* | 11/2010 | Roy et al. | ..... | 380/278 |
| 2012/0250429 A1* | 10/2012 | Tailliet et al. | ..... | 365/189.011 |

* cited by examiner

*Primary Examiner* — Julio J Maldonado
*Assistant Examiner* — Jaehwan Oh
(74) *Attorney, Agent, or Firm* — Christopher P. Malorana, PC (57) ABSTRACT

An apparatus comprising an integrated circuit, an interconnect layer within said integrated circuit, and one or more connections. The integrated circuit may be configured to provide an electrically measurable interconnect pattern by enabling one or more of a plurality of components. The one or more connections may each configured to enable a respective one of the components. The connections may be programmable while the apparatus is part of a wafer. The interconnect pattern may be configured to identify the apparatus after the apparatus has been manufactured.

23 Claims, 8 Drawing Sheets

ELECTRICALLY MEASURABLE ON-CHIP IC SERIAL IDENTIFIER AND METHODS FOR PRODUCING THE SAME

FIELD OF THE INVENTION

The present invention relates to circuit manufacturing and identification generally and, more particularly, to a method and/or apparatus for implementing an electrically measurable on-chip IC serial identifier and/or methods for producing the same.

BACKGROUND OF THE INVENTION

In conventional approaches, after process completion, Integrated Circuits (ICs) can have a visual on-chip pattern to determine their original position on a wafer. This pattern is a label usually referring to a row/column (R/C) identifier (or sometimes some type of serial number scheme) made in a 1X contact layer mask (e.g., 1st metal or nitride layer). With this method, the wafer die position is retrieved by a visual inspection under microscope. These visual methods, including X-rays, may be problematic to maintain a full traceability system of the IC, especially in the case where the dies are coated with opaque material or subsequently assembled in lidded packages. The package cover or lid (e.g., metal or dielectric) or over-molding compound of these packages precludes easy reading. Furthermore, it is also extremely difficult and costly to setup a high volume pick and place and marking process at the assembly level that allows the reprint of known good die identifiers on the top of the packages. Therefore, only the part number and lot code are usually printed, and the die position is lost at this assembly process step and full traceability is broken.

It would be desirable to implement an electrically measurable on-chip IC identifier. It would also be desirable to implement an on-chip identifier with a value that may be measured electrically, for example, by direct probing.

SUMMARY OF THE INVENTION

The present invention concerns an apparatus comprising an integrated circuit, an interconnect layer within the integrated circuit, and one or more connections. The integrated circuit may be configured to provide an electrically measurable interconnect pattern by enabling one or more of a plurality of components. The one or more connections may each be configured to enable a respective one of the components. The connections may be programmable while the apparatus is part of a wafer. The interconnect pattern may be configured to identify the apparatus after the apparatus has been manufactured.

The objects, features and advantages of the present invention include providing electrically measurable on-chip IC serial identifier that may (i) overcome breaches in traceability by integrating an on-chip identifier, (ii) provide an on-chip identifier that may be measured electrically, (iii) provide different methods for producing an IC electrical identifier, (iv) track a packaged part back to a particular die location on a wafer, (v) be implemented using a nitride or metal mask and existing foundry visual ID, (vi) implement a full custom identification cell, (vii) may be used to record measurements of a particular die on a wafer to assist with possible failure analysis, and/or (viii) be implemented without adding to the cost of the device (or adding very little).

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
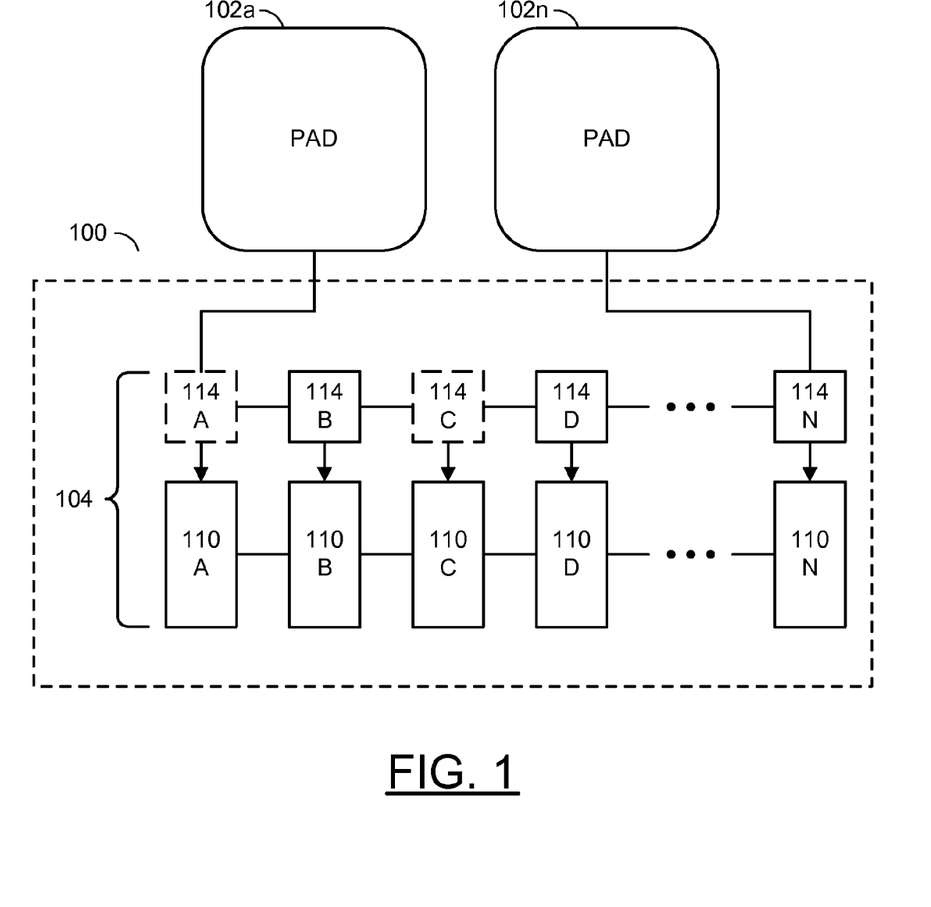
FIG. 1 is a block diagram illustrating an embodiment of the present invention.

Referring to FIG. 1, a block diagram of an apparatus 100 is shown in accordance with an embodiment of the present invention. The apparatus 100 may be implemented as part of an Integrated Circuit (IC) die. The apparatus 100 generally may be connected to a number of pads 102a-102n. The apparatus 100 may include a block (or circuit) 104. The block 104 may be implemented as a logic circuit. In one example, the block 104 may be implemented on a nitride or metal layer of the apparatus 100. An identification stored in the logic circuit 104 may be retrieved through one or more of the pads 102a-102n. In one example, an identification may be retrieved through a reading of a radio transmission.

The logic circuit 104 may be implemented as a number of devices 110a-110n and a number of elements 114a-114n. The devices 110a-110n may be implemented as one or more resistors, capacitors, transistors, diodes, etc. In one example, the devices 110a-110n may be implemented as a combination of resistors, transistors, capacitors, diodes, etc. The elements 114a-114n may be implemented as a number of interconnects. The interconnects 114a-114n may be programmable to be either present (e.g., connected) or not present (e.g., not connected). The interconnects 114a-114n may be programmed at a wafer level (e.g., during wafer deposition) within each die on a wafer.

Figure 2:
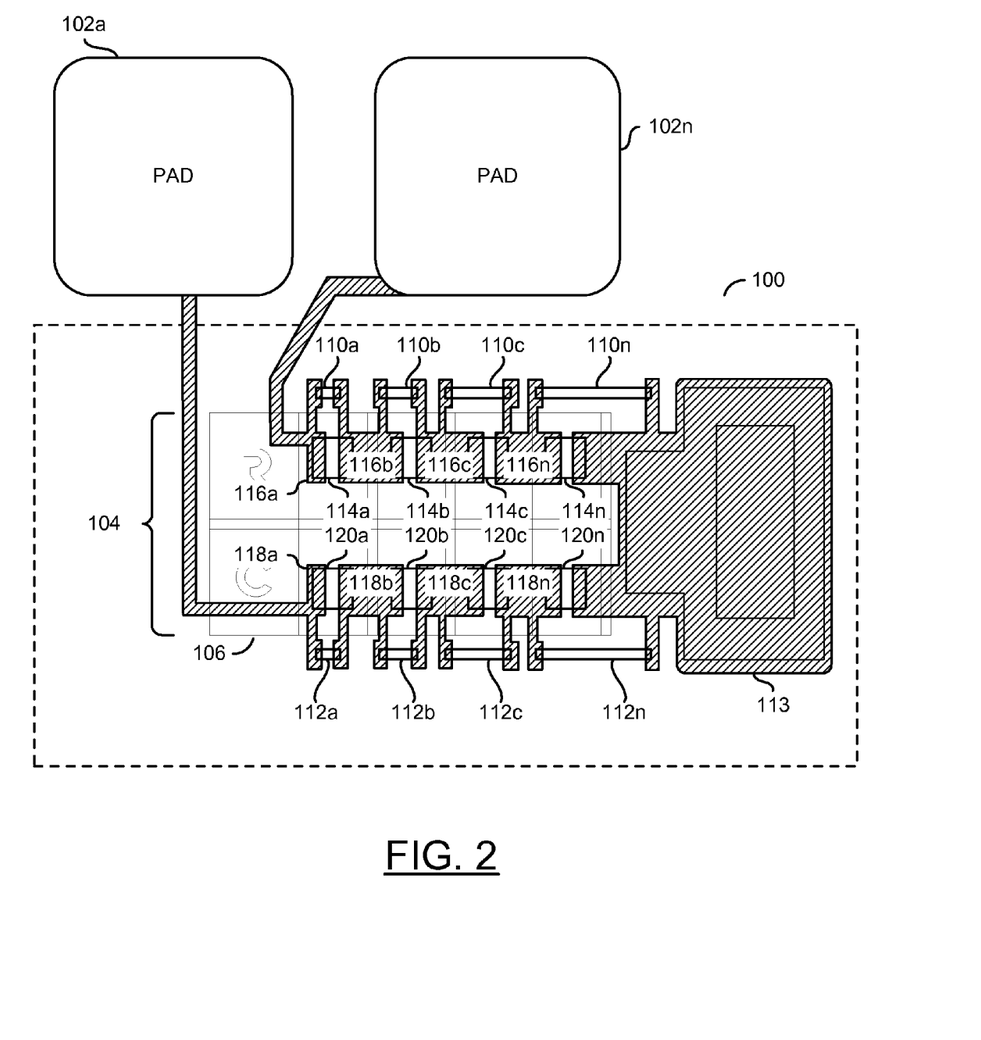
FIG. 2 is a layout diagram of an Integrated Circuit die in accordance with an embodiment of the present invention.

Referring to FIG. 2, an example of an implementation of the circuit 100 is shown. The circuit 100 also includes a number of devices 112a-112n, a ground reference, a number of devices 118a-118n, and a number of elements 120a-120n. The devices 112a-112n may be similar to the devices 110a-110n. The elements 116a-116n and/or the devices 118a-118n may be implemented as a layer (e.g., a metal layer) configured to connect the interconnects 114a-114n and/or 120a-120n. The devices 120a-120n may be similar to the elements 114a-114n. The interconnects 114a-114n and/or 120a-120n may form an interconnect matrix (or array). The interconnect matrix may implement a basic read only memory device. One of the pads 102a-102n may be implemented as a reference pad.

The devices 110a-110n and/or the devices 112a-112n may be implemented in a ladder configuration. In one example, the ladder may be a configuration of series resistors used to code one or more numbers representing a particular row/column of where the apparatus 100 was located on a wafer during fabrication. The row/column numbers may be used to identify the apparatus 100 during post-production troubleshooting. The devices 110a-110n and/or 112a-112n may be contacted (e.g., shorted) with the interconnect array of the elements 114a-114n and/or 120a-120n. In the example shown, when one of the elements 114a-114n and/or 120a-120n are present, the corresponding devices 110a-110n and/or 112a-112n are bypassed.

The elements 114a-114n and/or 120a-120n may be implemented, in one example, in accordance with procedures for implementing visual RC ID elements. However, the particular implementation of the elements 114a-114n and/or 120a-120n may be varied to meet the design criteria of a particular implementation. For example, the elements 114a-114n and/or 120a-120n may be both visually readable and be used to enable a particular combination of the devices 110a-110n and/or 114a-114n.

The values (e.g., a particular resistance) of the devices 110a-110n and/or the devices 112a-112n enabled may be implemented in a progressive manner, such as 50 ohms, 100 ohms, 200 ohms, 400 ohms, etc. In one example, the devices 110a-110n and/or the devices 112a-112n may be implemented using a resistive metal (e.g., TaN, NiCr, etc.). The resistance value read may be the total resistance of all of the resistors (or devices) enabled by the particular interconnects 114a-114n that are present. In a manufacturing environment, a number of the apparatus 100 are normally implemented on a wafer. Each apparatus 100 implemented normally has a unique identifier coded defined by the interconnects 114a-114n. A unique identifier may be an identifier that may be read confidently and/or categorically to be associated with a particular device intended to be identified. In certain instances (e.g., a lot number, etc.) an identifier may be intended to be used on more than one device.

In one example, a progressive increase in values may be implemented. By implementing a progressive increase in the value of the devices 110a-110n and/or 112a-112n, an overlap situation may be reduced. Reducing overlap may help to provide a unique identification for each of the apparatus 100 implemented on a wafer. Also, the particular magnitude of resistance may also be varied. For example, resistances of 1 ohm, 2 ohms, 4 ohms, 8 ohms, $2^n$ ohms may be implemented. In another example, resistances such as 1 ohm, 2.2 ohms, 4.7 ohms, etc. may be implemented in a non-overlapping scale. A set of resistance values may be implemented within a normalized series (e.g., E12, E24, E48, E96, and/or E192 series) to minimize overlaps. Whatever the particular coding scheme implemented, each resistance value is normally unique from the other resistance values.

In general, a plurality of pads 102a-102n are shown. The number of pads read may influence (or relate to) the amount of information stored about the apparatus 100. For example, if a plurality of pads 102a-102n are used to read information, then one of the pads 102a-102n may be implemented for a row and another of the pads 102a-102n may be used to read a column. However, a single one of the pads 102a-102n may be used to read the information if a single row (or other amount of information) is all that is needed. Since the identification may be embedded within the interconnects 114a-114n, very little die area (or real estate) may be needed.

Figure 3:
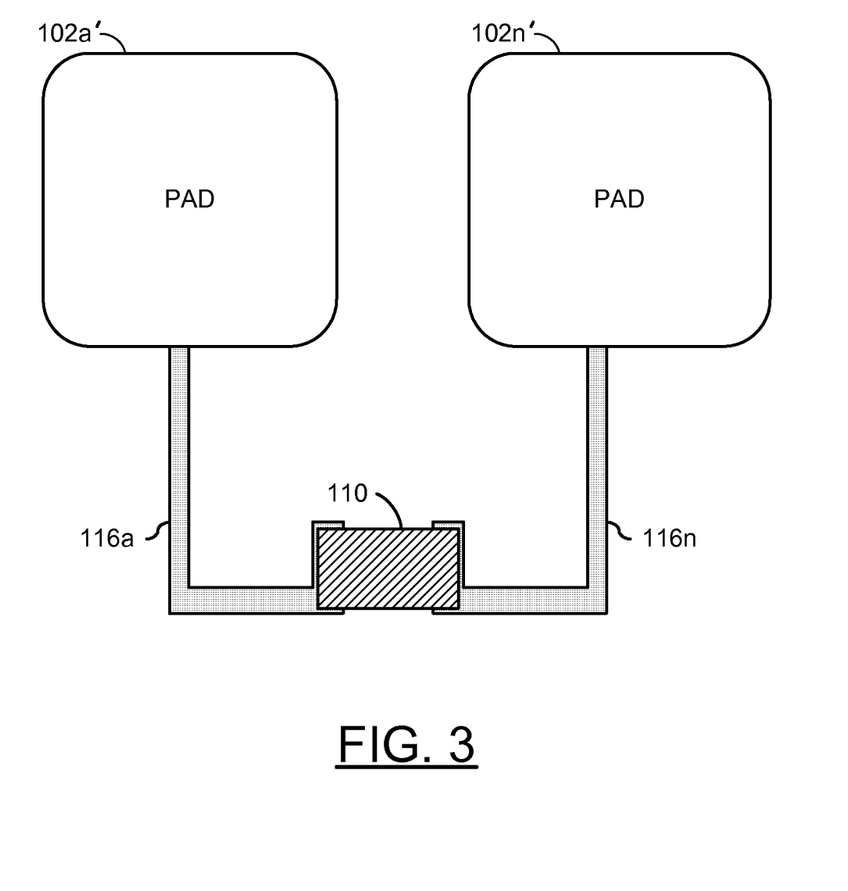
FIG. 3 is a diagram of a basic embodiment.

Referring to FIG. 3, a diagram of a basic embodiment is shown. A device 110 is shown connected between a pad 102a' and a pad 102n'. The metal layers 116a-116n are shown connecting the device 110 to the pads 102a'-102n'. The device 110 may be implemented, in one example, as a resistor. The value of the device 110 may be varied to present a particular value when probed by the pads 102a-102n.

Figure 4:
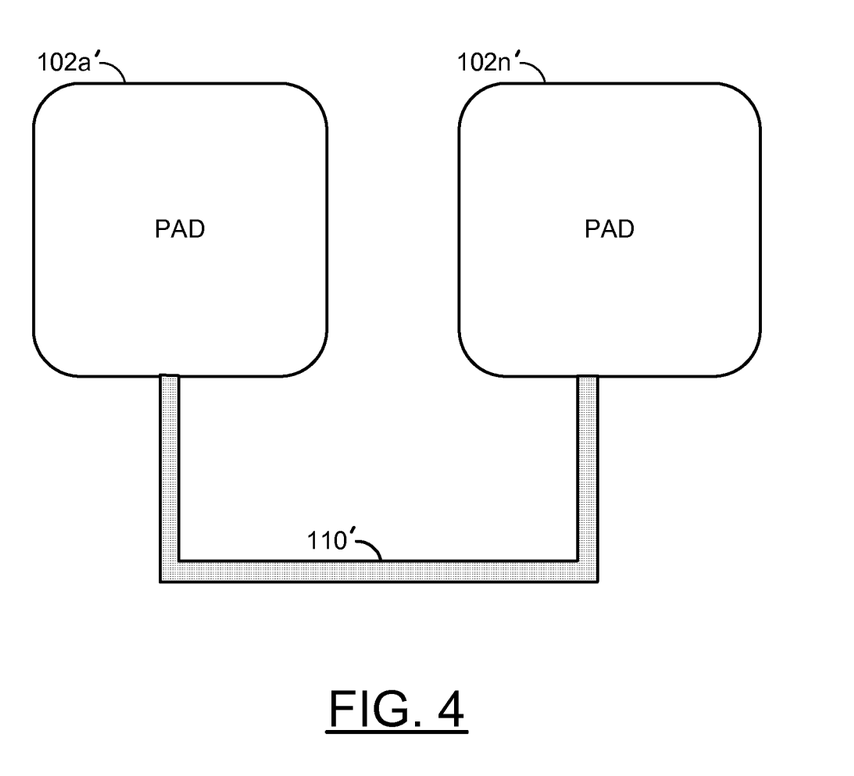
FIG. 4 is a diagram of an alternate embodiment illustrating a serial configuration.

Referring to FIG. 4, an alternate embodiment is shown implementing a serial configuration. A device 110' is shown implemented as a generally continuous layer between the pad 102a' and the pad 102n'. The embodiment of FIG. 4 does not need to implement a metal layer. The device 110' may be implemented as a resistive layer, where the length of the resistance (e.g., the dimensions) may vary the value of the resistance. The layer 110' may be programmed at wafer level.

Figure 5:
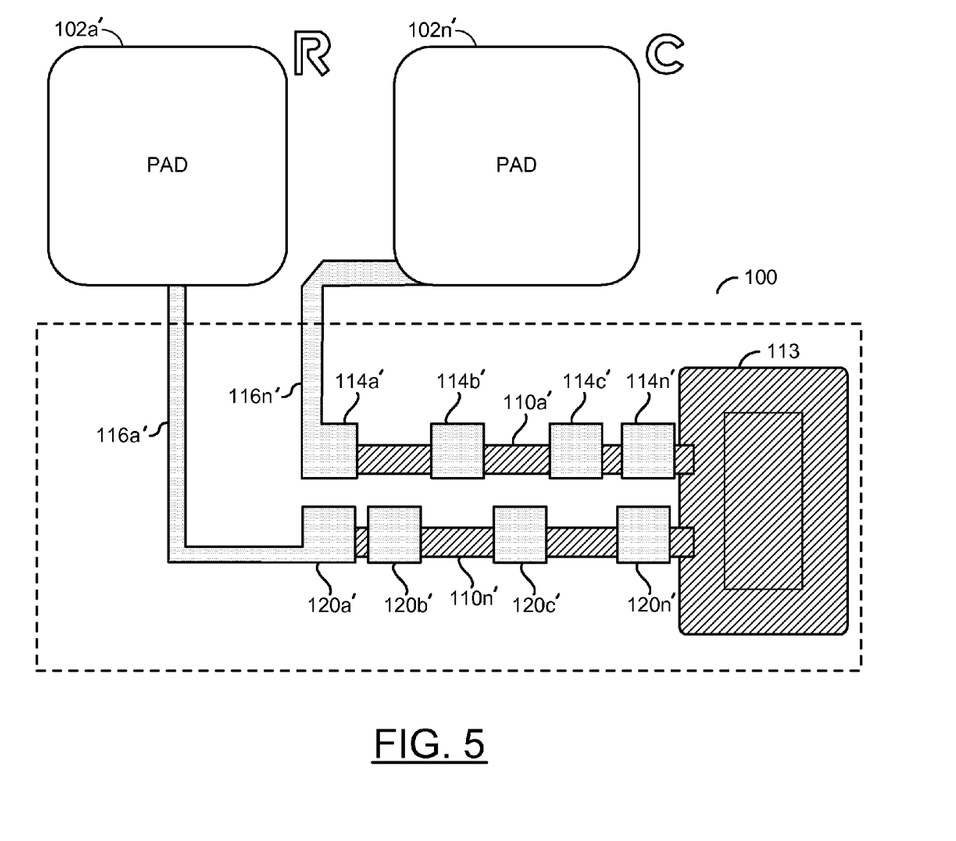
FIG. 5 is a diagram of an alternate embodiment showing a parallel row/column coding.

Referring to FIG. 5, an embodiment is shown implementing parallel row/column coding. The metal layers 116a'-116n' are shown connected between the pads 102a'-102n'. The interconnects 114a'-114n' and/or the interconnects 120a'-120n' are shown connected between the metal layers 116a-116n and the ground reference 113. A device 110a' and a device 110n' are shown connected between the metal layer 116a' and the metal layer 116n' and the ground reference 113. The length and/or width of the devices 110a' and 110n' may be varied to modify the value presented at the pads 102a'-102n'. The devices 114a'-114n' and/or the devices 120a'-120n' may be programmed at wafer level with a metal and/or via pattern. The resistance value presented at the pads 102a'-102n' may vary in response to which of the devices 114a'-114n' and/or 120a'-120n' are programmed.

Figure 6:
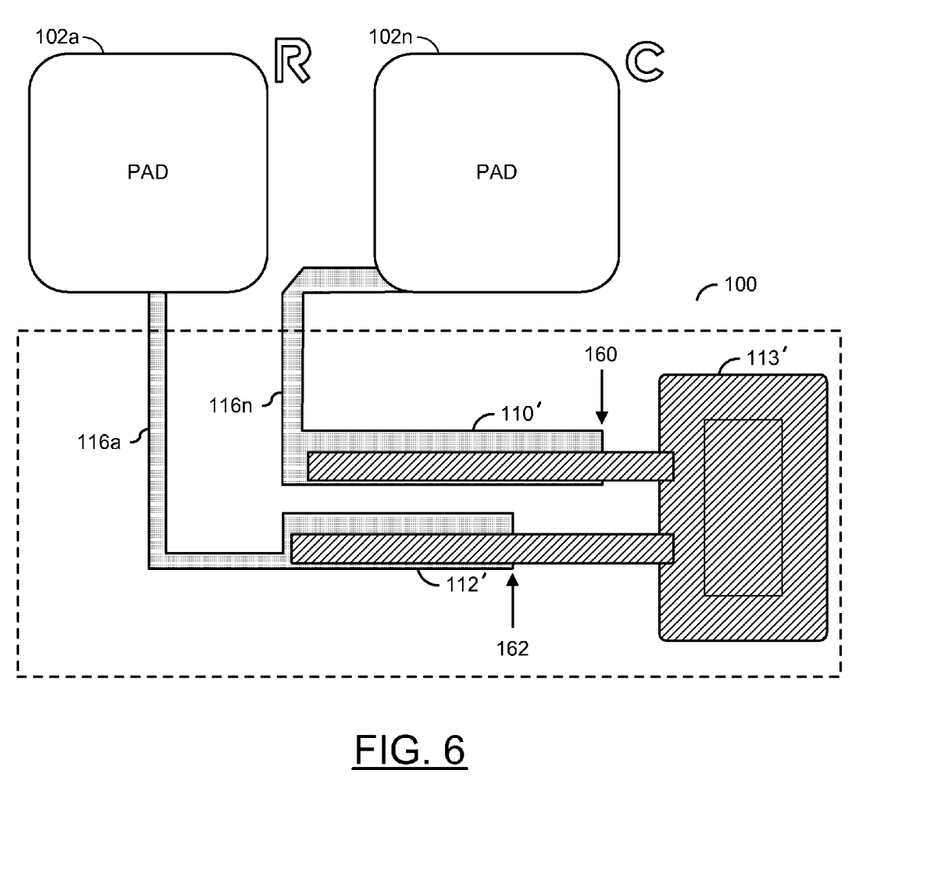
FIG. 6 is an alternate embodiment showing a variable length resistor.

Referring to FIG. 6, another alternate embodiment is shown. A resistor 110' and a resistor 112' are shown having a variable length. The variable length of the resistor 110' is shown ending at an arrow 160. The variable length of the resistor 112' is shown ending at an arrow 162. In the example shown, the resistor 110' is shown slightly longer than the resistor 112'. The resistor 110' may implement a higher resistance value than the resistor 112'. The resistance value of the resistor 110' may be defined by the distance to the arrow 160 times a width. The resistor 112 may have a value similarly defined. In the embodiment of FIG. 6, a single metal line (e.g., 116a and/or 116n) may be used to program the unique value for each of the row and/or column of the ID code. The end points 160 and/or 162 of the metal layer 116a and/or 116n connecting the resistor 110' and/or the resistor 112' may be programmed at wafer level using a continuous metal and/or via pattern. Various combinations of the embodiments of FIG. 3-FIG. 6 may be implemented.

Figure 7:
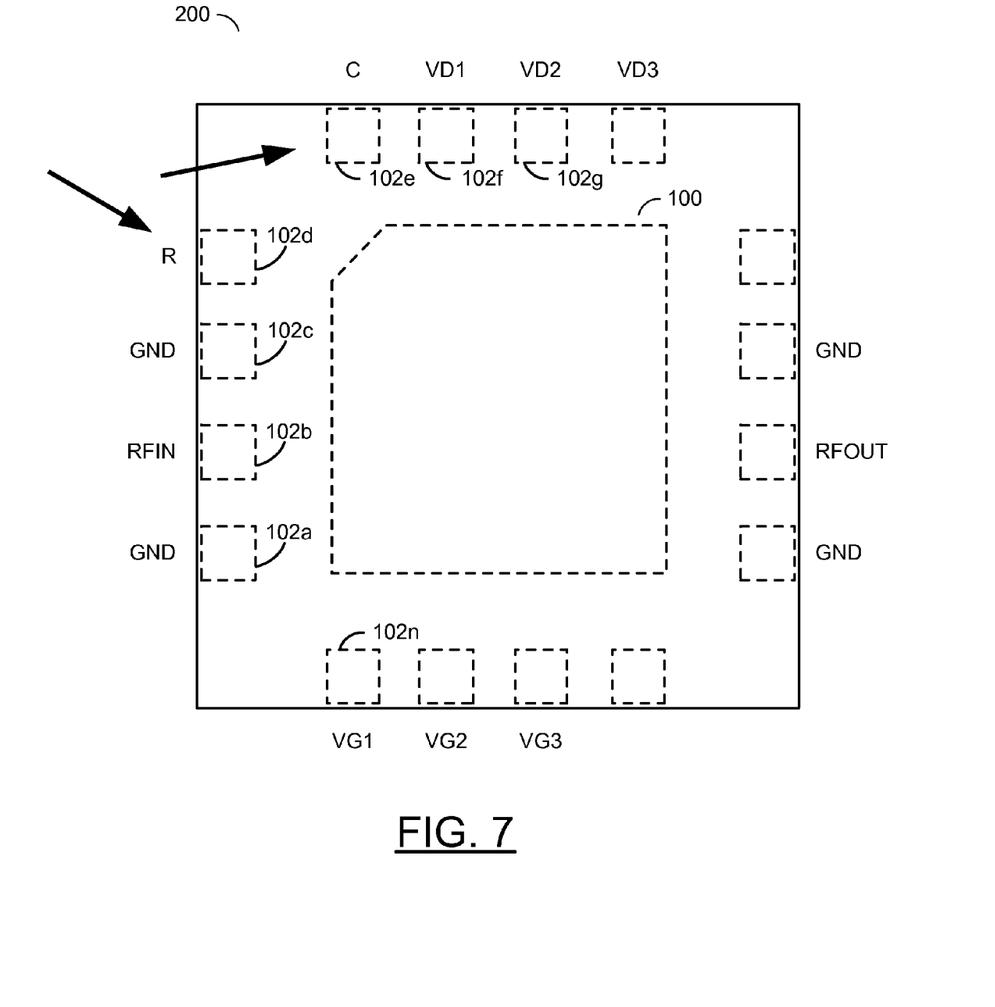
FIG. 7 is a diagram of an Integrated Circuit package.

Referring to FIG. 7, an example of a package 200 is shown. The package 200 generally comprises a number of pads 102a-102n. The pad 102d is shown with the marking R. The pad 102d may be used to read a row parameter from the circuit 100. The pad 102e is shown marked C. The pad 102e may be used to read a column parameter from the circuit 100. The various pads 102a-102n may be used to perform various functions (e.g., a supply voltage VD1, VD2, VD3, a ground GND, etc.). By DC probing one or two package pins connected to the pads 102a-102n, tracking of a particular packaged part may be implemented down to an original die location on the wafer.

While a row/column coding has been described, coding of an identifier over a single one of the pads 102a-102n is also possible. The apparatus 100 may be implemented using very little extra GaAs estate (<200×100 µm). The apparatus 100 may be compatible with most IC manufacturers standard visual and/or RC identification layer in nitride or metal layer.

Figure 8:
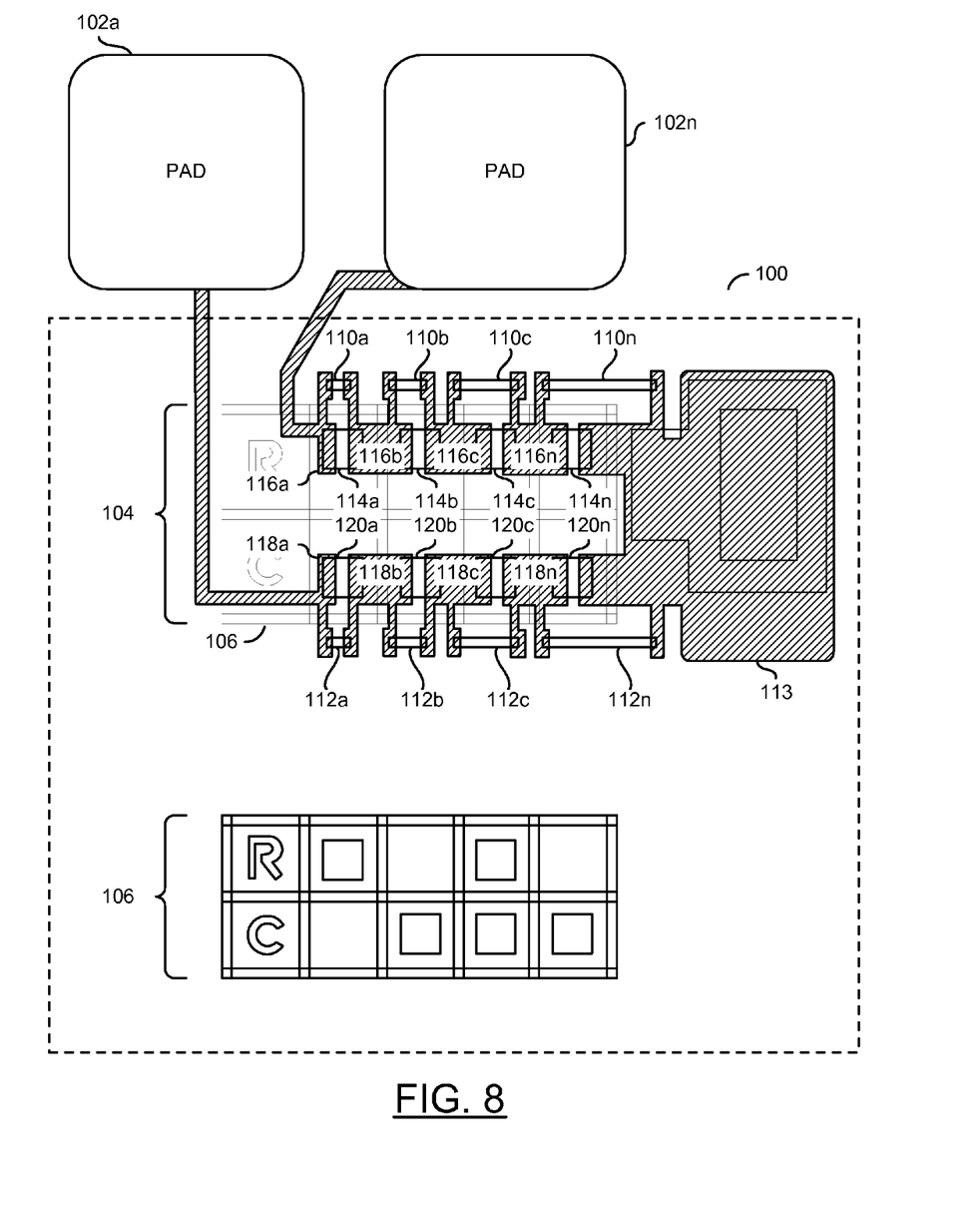
FIG. 8 is a diagram of the present invention implemented along with a visual ID pattern.

Referring to FIG. 8, a diagram of the apparatus 100" along with a visual ID 106' is shown. The interconnects 114a-114n may be implemented using (i) a standard nitride or metal mask and/or foundry RC ID cell, or (ii) using a custom RC cell. The interconnects 114a-114n may be used to form an electrically readable ID. The interconnects 114a'-114n' may be used to implement a visually readable ID. The apparatus 100″ may implement both an electrically readable ID and a visually readable ID.

The apparatus 100 may be implemented as a die or packaged IC having at least a differential terminal (e.g., one pad and one ground reference, two pads, etc.). A serial identification number (or other identifier) may be read from a direct electrical probe measurement. The interconnects 114a-114n may be formed from a number of metal and/or dielectric openings forming an interconnect pattern, A read-only-memory device, switchable at wafer layer deposition level may be implemented. A combination of resistors, capacitors and/or transistors and/or diodes, or combinations may be implemented. In one example, multiple terminals may be used to present different information that has been coded (e.g., row, column, version, lot number, etc.). The information may be retrieved either from a DC, AC and/or asynchronous measurement.

In one example, manufacturing of a specific mask and/or layout process may be used to generate the interconnects 114a-114n. The interconnects 114a-114n may be similar to the visual RC identifiers sometimes used. The interconnects 114a-114n may be used as an interconnect matrix to switch the devices 110a-110n or to code, for example, a row/column position. The interconnects 114a-114n may create an electrically measurable parameter (e.g., through probing, radio transmission, etc.) with unique value referenced to the particular position of the apparatus 100 on the wafer. The matrix of metal or nitride interconnects 114a-114n may be used to code a row/column position (or other information) as a unique electrically measurable parameter. The interconnects 114a-114n may be implemented using very little extra die area (e.g., <100×100 μm2 for a 2×5-bit resistor ladder). Furthermore, a lot number (or other information) may also be coded and later electrically measured, regardless of whether the die 100 is packaged or not. The apparatus 100 may ensure traceability of an IC part down to a original location on a wafer, including lot number.

While the invention has been particularly shown and described with reference to the preferred embodiments thereof, it will be understood by those skilled in the art that various changes in form and details may be made without departing from the scope of the invention.

The invention claimed is:

1. An apparatus comprising: an integrated circuit; an interconnect layer within said integrated circuit configured to provide an electrically measurable interconnect pattern by enabling one or more of a plurality of components; and one or more connections each configured to enable a respective one of said components, wherein (i) said connections are programmable (a) while said apparatus is part of a wafer and (b) during a wafer deposition step of the fabrication of said wafer and (ii) said interconnect pattern is configured to electrically identify said apparatus after said apparatus has been manufactured.

2. The apparatus according to claim 1, wherein said interconnect pattern comprises a read only memory device.

3. The apparatus according to claim 1, wherein said interconnect pattern comprises a plurality of metal connections.

4. The apparatus according to claim 1, wherein said interconnect pattern comprises a plurality of layer-to-layer via openings.

5. The apparatus according to claim 1, wherein said interconnect pattern comprises an identification pattern readable through a radio signal transmitted from said integrated circuit.

6. The apparatus according to claim 1, wherein said interconnect pattern comprises an identification pattern electrically readable through probing one or more terminals of said integrated circuit.

7. The apparatus according to claim 6, wherein said identification comprises a serial number of said integrated circuit configured to be electrically readable through a differential measurement of at least two of said terminals.

8. The apparatus according to claim 1, wherein said interconnect pattern comprises a row and a column of connections configured to provide said identification of said apparatus.

9. The apparatus according to claim 1, wherein said components comprise one or more passive components.

10. The apparatus according to claim 1, wherein said components comprise one or more resistors.

11. The apparatus according to claim 1, wherein said components comprise one or more diodes.

12. The apparatus according to claim 1, wherein said components comprise one or more capacitors.

13. The apparatus according to claim 1, wherein said components comprise one or more transistors.

14. The apparatus according to claim 1, wherein said components comprise a combination of two or more of resistors, transistors, capacitors, and diodes.

15. The apparatus according to claim 1, wherein (i) a plurality of said apparatus are manufactured on said wafer, and (ii) each of the plurality of apparatus are configured to have a unique interconnect pattern to provide a unique identification parameter on each of said plurality of apparatus.

16. The apparatus according to claim 1, wherein a said apparatus comprises a plurality of terminals, wherein each of said terminals includes information about one or more of a row number, a column number, a version number, and a lot number.

17. The apparatus according to claim 1, wherein said interconnect pattern is retrieved from one or more of a DC measurement, an AC measurement, a radio measurement and an asynchronous measurement.

18. The apparatus according to claim 1, wherein said interconnect pattern is configured as a foundry RC-ID pattern.

19. The apparatus according to claim 1, wherein said interconnect pattern is configured as a customized RC-ID pattern.

20. The apparatus according to claim 1, wherein said apparatus is configured to code one or more types of information selected from (i) a serial number, (ii) a lot code, (iii) a date code, (iv) a version code, or (v) similar information.

21. The apparatus according to claim 1, wherein each of said plurality of components has a different length.

22. A method for providing an identification code on an integrated circuit, comprising the steps of: (A) defining a plurality of devices on said integrated circuit; (B) defining a plurality of pads; (C) programming a plurality of interconnects during wafer deposition step of the fabrication of said integrated circuit between said plurality of devices and said plurality of pads, wherein an electrical identification value is configured to be read from said pads after said integrated circuit has been fabricated based on which of said interconnects are programmed.

23. The method according to claim 22, wherein (i) a plurality of integrated circuits are manufactured and (ii) each integrated circuit has a different combination of said interconnects programmed.

* * * * *